United States Patent
Kelly et al.

(10) Patent No.: US 11,752,608 B2
(45) Date of Patent: Sep. 12, 2023

(54) SYSTEMS AND METHODS FOR INSERTION AND REMOVAL OF INFORMATION HANDLING RESOURCE MODULE

(71) Applicant: Dell Products L.P., Round Rock, TX (US)

(72) Inventors: Nicholas Adam Kelly, Georgetown, TX (US); Matthew Dang, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 503 days.

(21) Appl. No.: 16/933,131

(22) Filed: Jul. 20, 2020

(65) Prior Publication Data
US 2022/0016751 A1     Jan. 20, 2022

(51) Int. Cl.
  *B25B 27/20*   (2006.01)
  *H05K 13/04*   (2006.01)
  *H01R 43/22*   (2006.01)
  *H01R 43/26*   (2006.01)

(52) U.S. Cl.
  CPC ............. *B25B 27/20* (2013.01); *H01R 43/22* (2013.01); *H01R 43/26* (2013.01); *H05K 13/0491* (2013.01)

(58) Field of Classification Search
  CPC ........ B25B 27/20; H01R 43/22; H01R 43/26; H05K 13/0491
  See application file for complete search history.

(56) References Cited

U.S. PATENT DOCUMENTS

| | | | | | |
|---|---|---|---|---|---|
| 4,392,301 | A | * | 7/1983 | Hannes | H05K 13/0491 29/758 |
| 4,723,361 | A | * | 2/1988 | Carlson | H05K 13/0491 29/758 |
| 4,756,078 | A | * | 7/1988 | Dougherty | H05K 13/0491 29/268 |
| 4,979,287 | A | * | 12/1990 | Schwab | H05K 13/0491 29/764 |
| 5,062,201 | A | * | 11/1991 | Long, Jr. | H05K 13/0491 29/764 |
| 5,265,328 | A | * | 11/1993 | Gorman | H05K 7/1415 29/829 |
| 5,365,653 | A | * | 11/1994 | Padrun | H05K 13/0491 29/764 |
| 5,842,261 | A | * | 12/1998 | Ortiz | H01R 43/205 29/260 |
| 2014/0170881 | A1 | * | 6/2014 | DeCesaris | H05K 13/0491 439/327 |

* cited by examiner

*Primary Examiner* — Peter Dungba Vo
*Assistant Examiner* — Jose K Abraham
(74) *Attorney, Agent, or Firm* — Jackson Walker L.L.P

(57) ABSTRACT

In accordance with embodiments of the present disclosure, a tool may include a main body and a plurality of fingers extending from one side of the main body, the fingers arranged in a plurality of rows and a plurality of columns such that in each of the plurality of rows, each pair of adjacent fingers in a row may have a gap formed in between such pair of adjacent fingers such that each gap may receive a component for insertion or removal from a system and such that the adjacent fingers apply a force to the component to retain the component within the tool. The tool may also include a receptacle formed at one end of the main body and configured to receive a removable arm, and wherein the removable arm is configured to receive a plurality of removable fingers.

12 Claims, 3 Drawing Sheets

SYSTEMS AND METHODS FOR INSERTION AND REMOVAL OF INFORMATION HANDLING RESOURCE MODULE

TECHNICAL FIELD

The present disclosure relates in general to information handling systems, and more particularly to insertion and removal of an information handling resource module in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

One type of information handling resource in which active liquid cooling may be used is dual inline memory modules or DIMMs. DIMMs are widely used in information handling systems to store data. Generational improvements have allowed DIMM pitch to decrease and DIMM count in information handling system servers to increase. Traditionally, DIMM insertion and removal has been performed one module at a time. As power consumption of information handling resources has increased, the need for liquid cooling has increased. While existing liquid cooling systems focus primarily on cooling of processors, future generations of information handling systems may benefit from active liquid cooling of DIMMs.

In order to cool a DIMM, a liquid cooling manifold may run directly on either side of the DIMM, in the channel between adjacent DIMMs. A space between the DIMM and the manifold may be filled with a thermal interface material. The thermal interface material may be somewhat delicate and may require careful installation in conjunction with a DIMM module itself, otherwise an unnecessarily high thermal contact resistance between the DIMM and the manifold may exist. Tight spaces among the thermal interface material, DIMM, and liquid manifold may render it difficult for a person to insert or remove DIMMs quickly in an information handling system, and may create service problems when a thermal interface material is improperly applied between two surfaces.

SUMMARY

In accordance with the teachings of the present disclosure, the disadvantages and problems associated with insertion and removal of an information handling resource from an information handling system may be substantially reduced or eliminated.

In accordance with embodiments of the present disclosure, a tool may include a main body and a plurality of fingers extending from one side of the main body, the fingers arranged in a plurality of rows and a plurality of columns such that in each of the plurality of rows, each pair of adjacent fingers in a row may have a gap formed in between such pair of adjacent fingers such that each gap may receive a component for insertion or removal from a system and such that the adjacent fingers apply a force to the component to retain the component within the tool. The tool may also include a receptacle formed at one end of the main body and configured to receive a removable arm, and wherein the removable arm is configured to receive a plurality of removable fingers. Features of the tool may be arranged such that in order to insert one or more components into the system, the receptacle remains unpopulated by the removable arm, the tool is inserted towards one or more respective connectors of the system for the one or more components, and a retention force applied by respective connectors to the one or more components maintains the one or more components in place when the tool is removed away from the respective connectors, and in order to remove one or more components from the system, the receptacle is populated with the removable arm, the removable arm is, for each component desired to be removed, populated with a respective removable finger, the tool is inserted towards one or more respective connectors of the system for the one or more components and a release force applied by the removable fingers releases the retention force, such that the force applied by the fingers is sufficient to remove the components from their respective connectors when the tool is removed away from the respective connectors.

In accordance with these and other embodiments of the present disclosure, a method may include forming a tool with a main body and a plurality of fingers extending from one side of the main body, the fingers arranged in a plurality of rows and a plurality of columns such that in each of the plurality of rows, each pair of adjacent fingers in a row may have a gap formed in between such pair of adjacent fingers such that each gap may receive a component for insertion or removal from a system and such that the adjacent fingers apply a force to the component to retain the component within the tool. The method may also include forming a receptacle at one end of the main body configured to receive a removable arm, wherein the removable arm is configured to receive a plurality of removable fingers. The tools may be formed such that in order to insert one or more components into the system, the receptacle remains unpopulated by the removable arm, the tool is inserted towards one or more respective connectors of the system for the one or more components, and a retention force applied by respective connectors to the one or more components maintains the one or more components in place when the tool is removed away from the respective connectors, and in order to remove one or more components from the system, the receptacle is populated with the removable arm, the removable arm is, for each component desired to be removed, populated with a respective removable finger, the tool is inserted towards one or more respective connectors of the system for the one or more components and a release force applied by the removable fingers releases the retention force, such that the force applied by the fingers is sufficient to remove the components from their respective connectors when the tool is removed away from the respective connectors.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
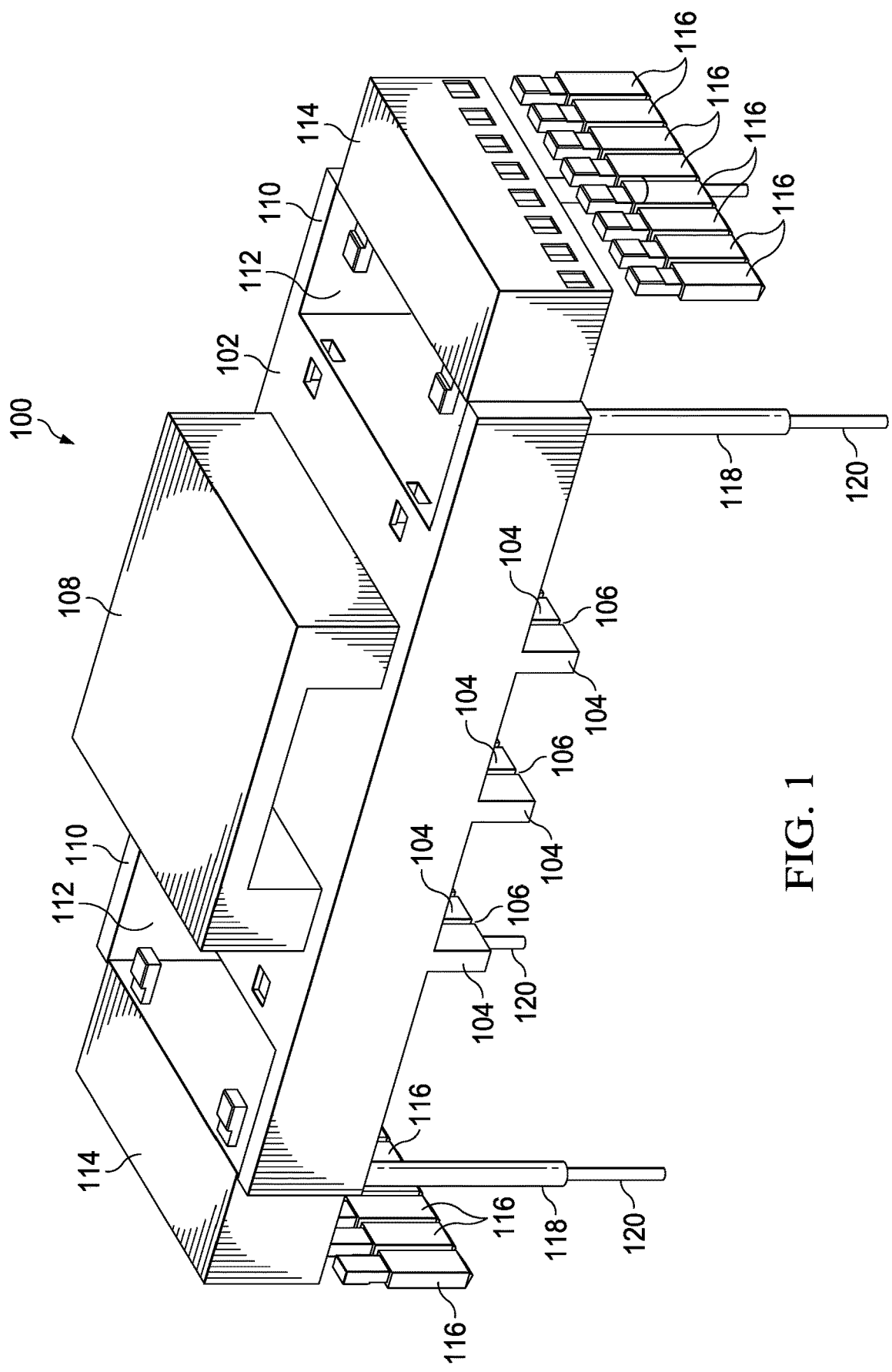
FIG. 1 illustrates an isometric view of an example tool for insertion and removal of DIMMs in an information handling system, in accordance with embodiments of the present disclosure.
Figure 2:
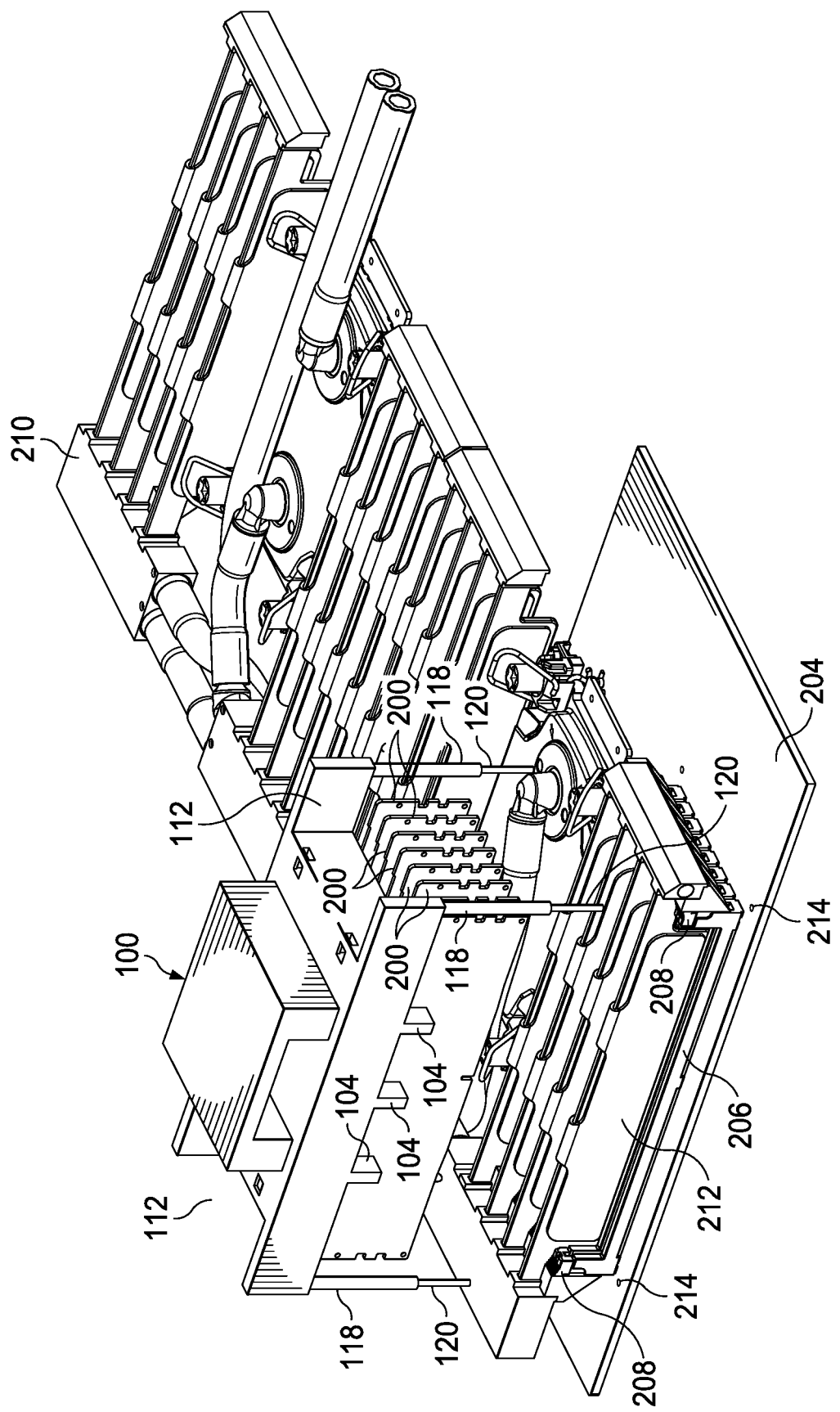
FIG. 2 illustrates an isometric view of the tool shown in FIG. 1 and selected components of an information handling system and demonstrates insertion of DIMMs into an information handling system, in accordance with embodiments of the present disclosure.
Figure 3:
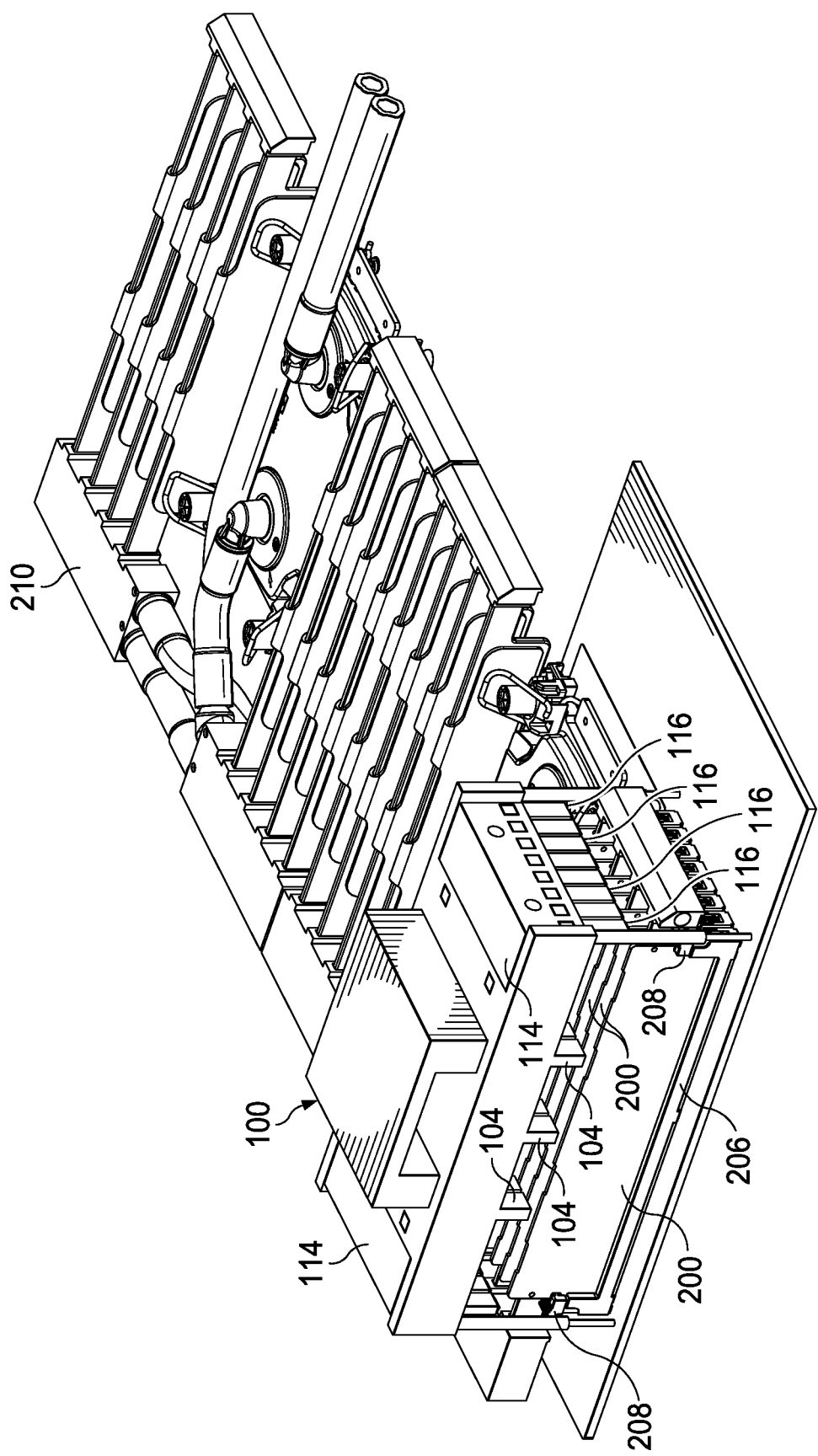
FIG. 3 illustrates an isometric view of the tool shown in FIG. 1 and selected components of an information handling system and demonstrates removal of DIMMs from an information handling system, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates an isometric view of an example tool 100 for insertion and removal of DIMMs in an information handling system, in accordance with embodiments of the present disclosure. As shown in FIG. 1, tool 100 may include main body 102, a plurality of spaced fingers 104 extending from a bottom of main body 102, a handle 108 extending from a top of main body 102 opposite of the bottom of main body 102, a pair of opposite ends 110 each having a receptacle 112 formed therein, a pair of removable arms 114 each configured to be selectively inserted and removed from a corresponding receptacle 112, a plurality of removable fingers 116 each configured to be selectively inserted and removed from a corresponding removable arm 114, a plurality of guide legs 118 extending from the corners of edges of the bottom of main body 102, and a plurality of guide pins 120 with each guide pin 120 extending from a respective guide leg 118.

As shown, fingers 104 may be arranged closely in rows along the bottom of tool 100 with small gaps 106 between pairs of fingers 104 in each row. Fingers 104 may also be arranged in columns along the bottom of tool 100, but with more spacing between fingers 104 in a column than with fingers 104 in a row. Fingers 104 may be arranged along the bottom of tool 104 such that a DIMM or other information handling resource may be grasped within a plurality of gaps 106 and held in place by compressive force between adjacent pairs of fingers 104 on either side of each gap 106.

Handle 108 may comprise any suitable mechanical feature adapted for use by a person to grasp handle 108 in order to insert and remove information handling resources, as described in greater detail below.

Receptacles 112 may be formed at each end 110 of main body 102, and each receptacle 112 may be configured to receive a respective removable arm 114. As described in greater detail below, removable arms 114 may be inserted into receptacles 112 in order to remove information handling resources from an information handling system. In addition, as described below, removable fingers 116 may also be inserted into removable arms 114 in order to remove information handling resources from an information handling system. However, if desired to remove only some but not all of a plurality of information handling resources from an information handling system, a user may leave receptacles of a removable arm 114 corresponding to information handling resources undesired for removal unpopulated without a removable finger 116 inserted therein. In operation during a removal, a removable finger 116 may be configured to interact with a latching mechanism of an information handling resource and/or a connector for receiving the information handling resource, in order to unlatch the latching mechanism to permit removal of such information handling resource.

When inserting information handling resources into an information handling system, removable arms 114 may be removed from main body 102.

FIG. 2 illustrates an isometric view of tool 100 and selected components of an information handling system and demonstrates insertion of DIMMs 200 into the information handling system, in accordance with embodiments of the present disclosure. As shown in FIG. 2, an information handling system may include a circuit board 204 (e.g., motherboard or backplane) having a plurality of receptacle connectors 206 each configured to receive a respective DIMM 200. As shown in FIG. 2, each receptacle connector 206 may include one or more latching mechanisms 208 to mechanically retain an installed DIMM 200 in place within such receptacle connector 206. Also as shown in FIG. 2, the information handling system may also include a liquid cooling system 210 that includes a manifold 212 arranged relative to receptacle connectors 206 in order to provide liquid cooling to DIMMs 200 installed in receptacle connectors 206.

As shown in FIG. 2, in order to insert DIMMs 200 into the information handling system, a user may insert each DIMM 200 desired to be installed into a plurality of gaps 106 such that each DIMM 200 is held in place within tool 100 by pairs of adjacent fingers 104. To engage each DIMM 200 with its respective receptacle connector 206, the user may lower the tool 100 towards circuit board 204, aligning guide pins 120 with corresponding guide holes 214 formed on or within circuit board 204. Once DIMMs 200 are lowered sufficiently to engage with their respective receptacle connectors 206, latching mechanisms 208 may engage DIMMs 200 and may retain DIMMs 200 within receptacle connectors 206 with sufficient force to overcome the force by which DIMMs 200 are held within gaps 106, such that after insertion of DIMMs 200 into receptacle connectors 206, the user may lift tool 100 away from circuit board 206 and DIMMs 200 may remain inserted into receptacle connectors 206.

FIG. 3 illustrates an isometric view of the tool 100 and selected components of the information handling system depicted in FIG. 2 and demonstrates removal of DIMMs 200 from the information handling system, in accordance with embodiments of the present disclosure. As shown in FIG. 3, to remove DIMMs 200 from the information handling system, the user may populate receptacles 112 of tool 100 with removable arms 114 and, for each DIMM 200 desired to remove, install a pair of opposing removable fingers 116 within removable arms 114 corresponding to the position of such desired DIMM 200. The user may lower the tool 100 towards circuit board 204, aligning guide pins 120 with corresponding guide holes 214 formed on or within circuit board 204. Once tool 100 is lowered sufficiently, removable fingers 116 may interact with latching mechanisms 208 to unlatch the desired DIMM(s) 200 from their respective receptacle connectors 206 and a plurality of gaps 106 may align with each desired DIMM 200 such that pairs of adjacent fingers 104 grasp each desired DIMM 200. The user may then lift tool 100 away from circuit board 206 and desired DIMMs 200 may remain retained in tool 100 while DIMMs 200 not desired for removal remain inserted in their respective receptacle connectors 206.

Although the foregoing describes insertion and removal of DIMMs 200 in an information handling system, it is understood that the methods and systems described herein may be applied for insertion and removal of any suitable information handling resources in an information handling system, and may be applied for insertion and removal of any component (whether or not electronic) from any suitable mechanical structure (whether or not electronic).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A tool, comprising:
   a main body;
   a plurality of fingers extending from one side of the main body, the fingers arranged in a plurality of rows and a plurality of columns such that in each of the plurality of rows, each pair of adjacent fingers in a row has a gap formed in between the pair of adjacent fingers such that each gap receives a component for insertion or removal from a system and such that the adjacent fingers apply a force to the component to retain the component within the tool; and
   a receptacle formed at one end of the main body and configured to receive a removable arm, and wherein the removable arm is configured to receive a plurality of removable fingers;
   such that:
      in order to insert one or more components into the system, the receptacle remains unpopulated by the removable arm, the tool is inserted towards one or more respective connectors of the system for the one or more components, and a retention force applied by latches of respective connectors to the one or more components maintains the one or more components in place when the tool is removed from the respective connectors; and
      in order to remove one or more components from the system, the receptacle is populated with the removable arm, the removable arm is, for each component desired to be removed, populated with a respective removable finger, the tool is inserted towards one or more respective connectors of the system for the one or more components and a release force applied by the removable fingers releases the retention force, such that the force applied by the fingers is sufficient to remove the components from their respective connectors when the tool is removed from the respective connectors.

2. The tool of claim 1, wherein the tool further comprises guiding features configured to align with corresponding alignment features of the system, in order to align the tool with the connectors.

3. The tool of claim 2, wherein the alignment features comprise holes and the guiding features comprise guide pins.

4. The tool of claim 1, wherein the component comprises an information handling resource and the system comprises an information handling system.

5. The tool of claim 1, wherein the component comprises a dual inline memory module and the system comprises an information handling system.

6. The tool of claim 1, wherein the release force is applied by the removable fingers to the latch of the connector.

7. A method, comprising:
   forming a tool with a main body and a plurality of fingers extending from one side of the main body, the fingers arranged in a plurality of rows and a plurality of columns such that in each of the plurality of rows, each pair of adjacent fingers in a row has a gap formed in between the pair of adjacent fingers such that each gap receives a component for insertion or removal from a system and such that the adjacent fingers apply a force to the component to retain the component within the tool; and
   forming a receptacle at one end of the main body configured to receive a removable arm, wherein the removable arm is configured to receive a plurality of removable fingers;
   such that:
      in order to insert one or more components into the system, the receptacle remains unpopulated by the removable arm, the tool is inserted towards one or more respective connectors of the system for the one or more components, and a retention force applied by latches of respective connectors to the one or more components maintains the one or more components in place when the tool is removed from the respective connectors; and
      in order to remove one or more components from the system, the receptacle is populated with the removable arm, the removable arm is, for each component desired to be removed, populated with a respective removable finger, the tool is inserted towards one or more respective connectors of the system for the one or more components and a release force applied by the removable fingers releases the retention force, such that the force applied by the fingers is sufficient to remove the components from their respective connectors when the tool is removed from the respective connectors.

8. The method of claim 7, further comprising forming guiding features on the tool configured to align with corresponding alignment features of the system, in order to align the tool with the connectors.

9. The method of claim 8, wherein the alignment features comprise holes and the guiding features comprise guide pins.

10. The method of claim 7, wherein the component comprises an information handling resource and the system comprises an information handling system.

11. The method of claim 7, wherein the component comprises a dual inline memory module and the system comprises an information handling system.

12. The method of claim 7, wherein the release force is applied by the removable fingers to the latch of the connector.

* * * * *